(12) United States Patent
Martin et al.

(10) Patent No.: US 7,338,614 B2
(45) Date of Patent: Mar. 4, 2008

(54) VAPOR HF ETCH PROCESS MASK AND METHOD

(75) Inventors: John R. Martin, Foxborough, MA (US); Timothy J. Brosnihan, Natick, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/397,409

(22) Filed: Apr. 4, 2006

(65) Prior Publication Data

US 2006/0223329 A1 Oct. 5, 2006

Related U.S. Application Data

(60) Provisional application No. 60/668,422, filed on Apr. 5, 2005.

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................... 216/49; 216/58
(58) Field of Classification Search .......... 430/5; 216/47, 48, 49, 56, 73, 41, 79; 438/694, 438/706, 725
See application file for complete search history.

(56) References Cited

U.S. PATENT DOCUMENTS

| | | | |
|---|---|---|---|
| 5,110,697 A * | 5/1992 | Lamb et al. | 430/14 |
| 5,399,462 A * | 3/1995 | Sachdev et al. | 430/323 |
| 5,939,633 A | 8/1999 | Judy | 73/514.32 |
| 6,074,951 A | 6/2000 | Kleinhenz et al. | 438/701 |
| 6,080,529 A * | 6/2000 | Ye et al. | 430/318 |
| 6,162,585 A * | 12/2000 | Zhang et al. | 430/313 |
| 6,268,232 B1 | 7/2001 | Skapa et al. | 438/51 |
| 6,505,511 B1 | 1/2003 | Geen et al. | 73/504.12 |
| 6,511,859 B1 * | 1/2003 | Jiang et al. | 438/48 |
| 2004/0026366 A1 * | 2/2004 | Sharon et al. | 216/52 |

FOREIGN PATENT DOCUMENTS

JP 2004-004345 * 1/2004

OTHER PUBLICATIONS

Ben-Hamida et al. *Anhydrous HF etching for stiction-free MEMS process*, Micromachine Devices, vol. 5, No. 6, Jun. 2000, 2 pages.
Hanestad et al. *Stiction-Free Release Etch with Anhydrous HF/Water Vapor Processes*, FSI re-Print of Paper Presented at SPIE MEMS Conference, Oct. 2001, 11 pages.
Marie A. Lester *Selective Material Removal for Nanostructure Formation*, Semiconductor International, vol. 26, No. 6, Jun. 2003, p. 40.
Patent Abstracts of Japan, vol. 004, No. 087, Jun. 21, 1980 and JP 55 055532 A (Chiyou LSI Giijutsu Kenkyu Kumiai), Apr. 23, 1980, one page.

(Continued)

*Primary Examiner*—Roberts Culbert
(74) *Attorney, Agent, or Firm*—Bromberg & Sunstein LLP

(57) ABSTRACT

A method of processing a semiconductor wafer provides a wafer, and then forms an organic mask on at least a portion of the wafer. The method then applies a vapor etching process to the wafer through holes in the organic mask.

6 Claims, 7 Drawing Sheets

OTHER PUBLICATIONS

C. Johnson, Jr. and B. Patnaik *Polymide Mask for Reactive Ion Etching of Metal Lines*, IBM Technical Disclosure Bulletin, vol. 22, No. 4, Sep. 1979, pp. 1446-1448.

P. Gori *International Search Report and Written Opinion of the International Searching Authority*, PCT/US2006/012456, Aug. 31, 2006, 11 pages.

* cited by examiner

VAPOR HF ETCH PROCESS MASK AND METHOD

PRIORITY

This patent application claims priority from Provisional U.S. Patent Application No. 60/668,422, filed Apr. 5, 2005, entitled, "VAPOR HF ETCH PROCESS MASK," and naming John R. Martin and Timothy J. Brosnihan as inventors, the disclosure of which is incorporated herein, in its entirety, by reference.

FIELD OF THE INVENTION

The invention generally relates to semiconductor fabrication and, more particularly, the invention relates to masks used for etching and cleaning.

BACKGROUND OF THE INVENTION

Oxide films are used in a wide variety of silicon semiconductor products. For example, oxide layers commonly act as a sacrificial layer for releasing microstructure in MEMS devices. The art thus uses a number of different processes to remove or etch oxide layers. One process uses aqueous HF to remove sacrificial oxide under MEMS sensors. Unless preventive measures are taken, however, liquid surface tension can cause the MEMS microstructures to stick together ("stiction") upon removal from aqueous baths.

Another wafer fabrication application etches oxides by exposing them to HF vapor (hydrofluoric acid vapor). Such a vapor process is attractive because it substantially eliminates the surface tension that causes stiction. For a number of reasons, it often is preferable to apply the HF vapor with portions of the wafer protected by an organic mask. More specifically, among other reasons, an organic mask may be more readily removable from an underlying surface.

Undesirably, however, prior art organic masks known to the inventors generally cannot sufficiently block HF vapor when used in these applications. Specifically, the HF vapor often does not attack/degrade the organic material itself. Rather, it is an ineffective barrier—the HF vapor often diffuses through the organic material. In that case, after diffusing through the organic mask, the HF vapor may attack/degrade the underlying material (e.g., the wafer), causing the mask to debond from the reacting surface. Hard (i.e., inorganic) masks are sometimes an alternative, but they impose other process limitations. It should be noted that the term "etch" is used herein generally includes chemical reactions, cleaning and removal of surface films, particulates, and contaminants, as well as bulk removal of material.

SUMMARY OF THE INVENTION

In accordance with one aspect of the invention, a method of processing a semiconductor wafer provides a wafer, and then forms an organic mask on at least a portion of the wafer. The method then applies a vapor etching process to the wafer using the organic mask. The vapor reacts with exposed regions of the wafer that are not protected by the organic mask.

In illustrative embodiments, the vapor etching process includes a hydrofluoric vapor etching process. Moreover, the method may form the organic mask by depositing a layer of organic material to at least a portion of the face of the wafer, and then forming a supplemental mask (having at least one hole) on the organic material. The method then may form at least one hole through the layer of organic material by means of the at least one hole of the supplemental mask. Alternatively, the method may form the organic mask by exposing the organic mask to light having a prespecified pattern and then developing the organic mask. Alternatively, other techniques, such as laser ablation and lift-off processes may be used to pattern the mask.

The mask may be formed from certain organic materials, such as a parylene or a polyimide. Some embodiments further process the wafer, such as removing at least a portion of the organic mask. In yet other embodiments, the wafer may be provided by forming a MEMS device on the wafer and/or forming circuitry on the wafer.

In accordance with another aspect of the invention, a method of fabricating a micromachined product forms microstructure that is supported by a wafer, and then applies an organic material to at least a portion of the wafer. The method then produces a prespecified pattern of holes in the organic material to form an organic mask, and applies a vapor phase etching process to the wafer through the holes in the organic mask.

In accordance with other aspects of the invention, a method of fabricating a semiconductor device provides a wafer, and deposits a layer of organic material on a surface of the wafer. The method then forms a supplemental mask (with one or more holes therethrough) on the layer of organic material, and uses the supplemental mask to form one or more holes through the layer of organic material to form an organic mask. With this mask in place, the method applies a vapor etching process to the wafer through holes in the organic mask.

BRIEF DESCRIPTION OF THE DRAWINGS

The foregoing advantages of the invention will be appreciated more fully from the immediately following further description thereof with reference to the accompanying drawings.

DESCRIPTION OF ILLUSTRATIVE EMBODIMENTS

In illustrative embodiments, a semiconductor fabrication process uses an organic mask in a vapor etching process to etch an underlying material, such as oxide. To that end, the process may 1) apply an organic material to a surface of a wafer, 2) form a prespecified pattern of holes through the organic material to effectively transform the organic material into an organic mask, and 3) apply a vapor etching process to the wafer through holes in the organic mask. Among other types, the vapor etching process may be a hydrofluoric acid vapor etching process. Details of illustrative embodiments are discussed below.

Figure 1:
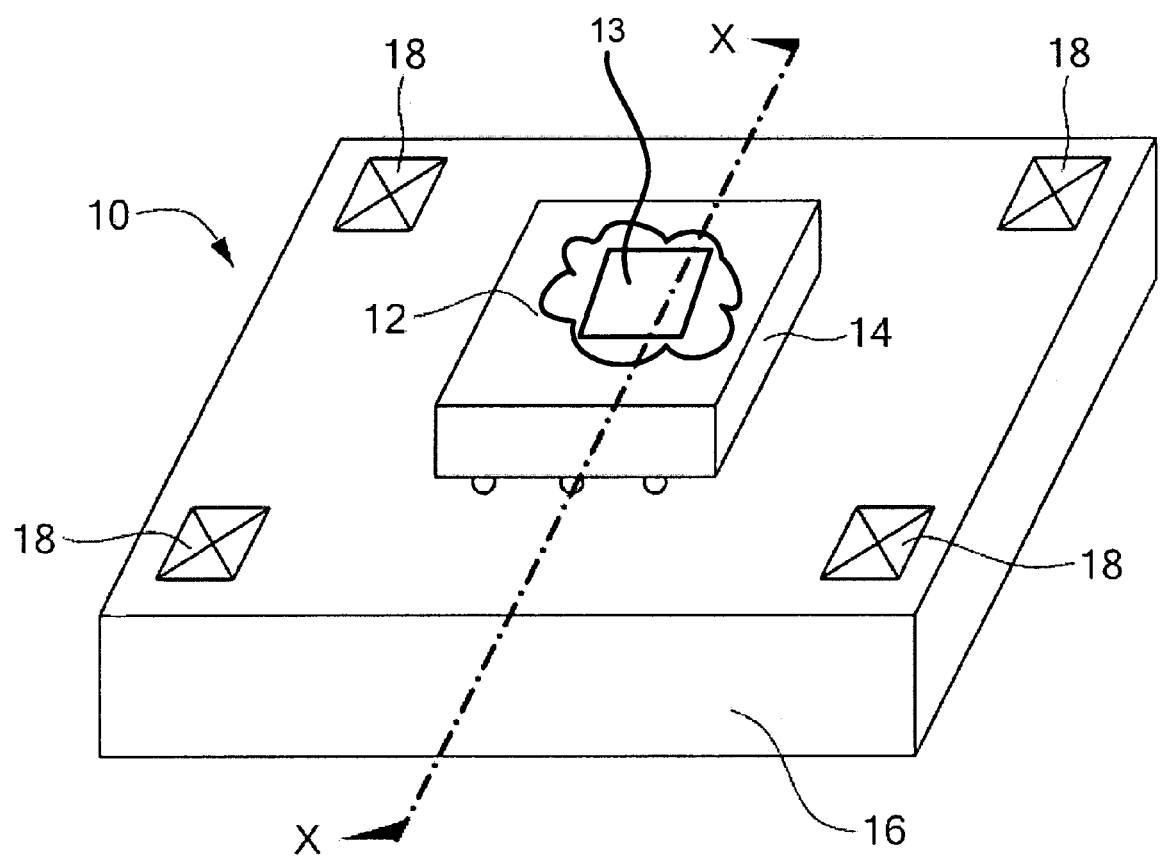
FIG. 1 schematically shows a partially cut-away view of a system having a MEMS device that may be produced in accordance with illustrative embodiments of the invention.

FIG. 1 schematically shows, in a partially cut-away view, an exemplary system 10 having a semiconductor chip 13 that may be formed in accordance with illustrative embodiments of the invention. Specifically, the system 10 includes a packaged semiconductor device 12 having a semiconductor chip/die 13 secured within a conventional semiconductor package 14. The package 14 is coupled with a circuit board 16 having interconnects 18 for electrically communicating with an external device, such as a computer. In illustrative embodiments, the chip 13 is a MEMS device and thus, the packaged semiconductor device 12 also is referred to herein as a "packaged MEMS device 12."

The semiconductor chip 13 may implement any conventionally known functionality commonly implemented on a MEMS device, such as an inertial sensor. Such a MEMS device 12 may have structure only, or both circuitry and structure. For example, the packaged MEMS device 12 may be a gyroscope or an accelerometer. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

Although the semiconductor chip 13 is discussed above as a MEMS device implemented as an inertial sensor, principles of illustrative embodiments can apply to other semiconductor devices and MEMS devices, such as pressure sensors and microphones. Accordingly, discussion of a MEMS inertial sensor is exemplary and not intended to limit the scope of various embodiments of the invention. Illustrative embodiments therefore may be used to form other semiconductor devices, such as digital signal processor integrated circuits/chips and microprocessor semiconductor circuits.

Figure 2:
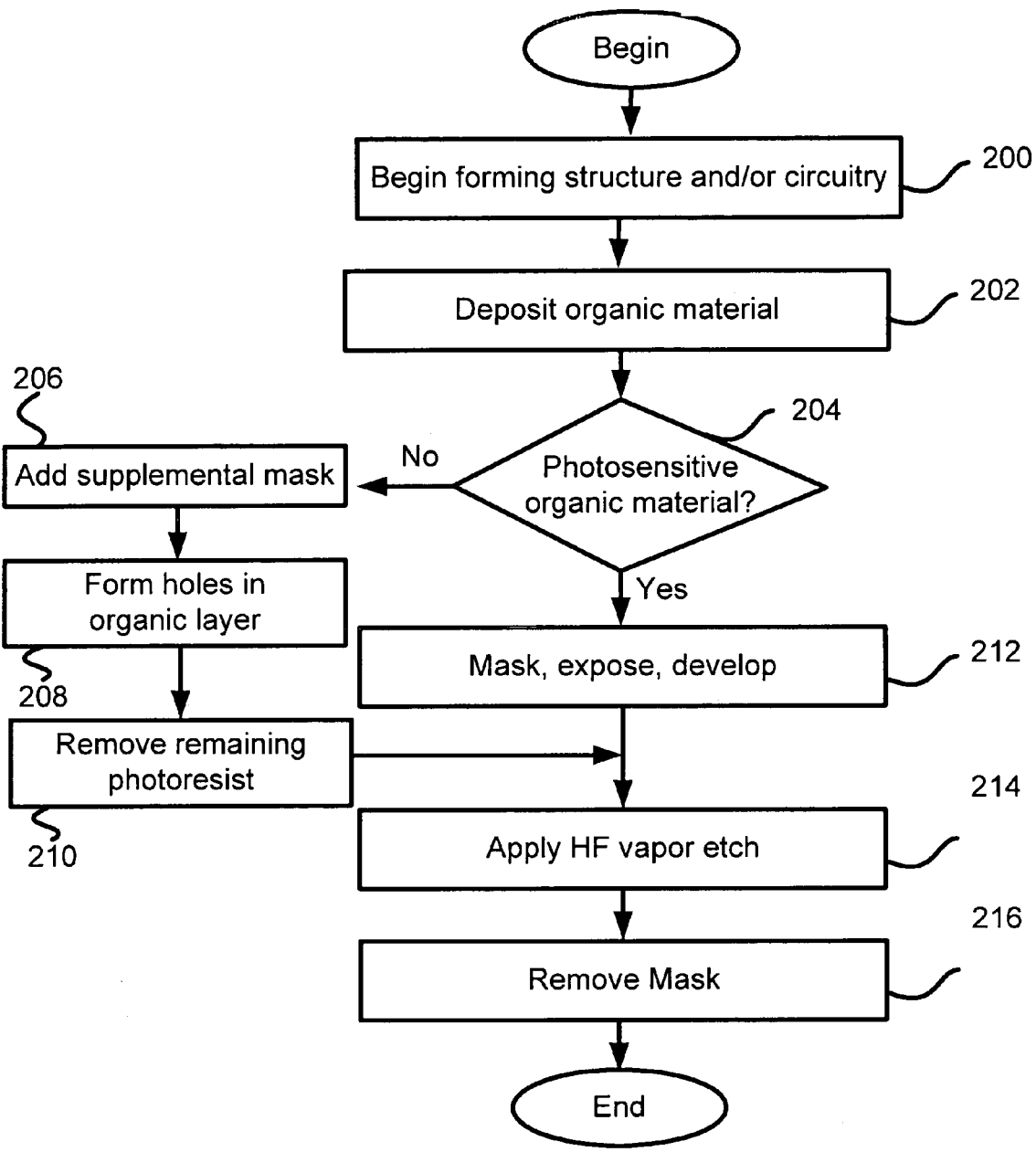
FIG. 2 shows a process of fabricating a semiconductor device, such as that shown in FIG. 1, in accordance with illustrative embodiments of the invention.

FIG. 2 shows a process of forming a semiconductor device, such as the MEMS die 13 within the package 14 shown in FIG. 1, in accordance with illustrative embodiments of the invention. The process began to step 200, which begins forming structure, circuitry, or both on a semiconductor wafer. To that end, in illustrative embodiments, a semiconductor wafer may be etched, and/or materials may be deposited or grown thereon, to begin forming the basic structures of the chip 13. For example, a silicon wafer may be selectively etched, and preliminarily receive sacrificial material and polysilicon 28 to begin fabricating a MEMS device. As noted above, however, step 200 simply has preliminary structures. Alternative embodiments, however, may already have some substantially completed circuitry and structure.

Figure 3:
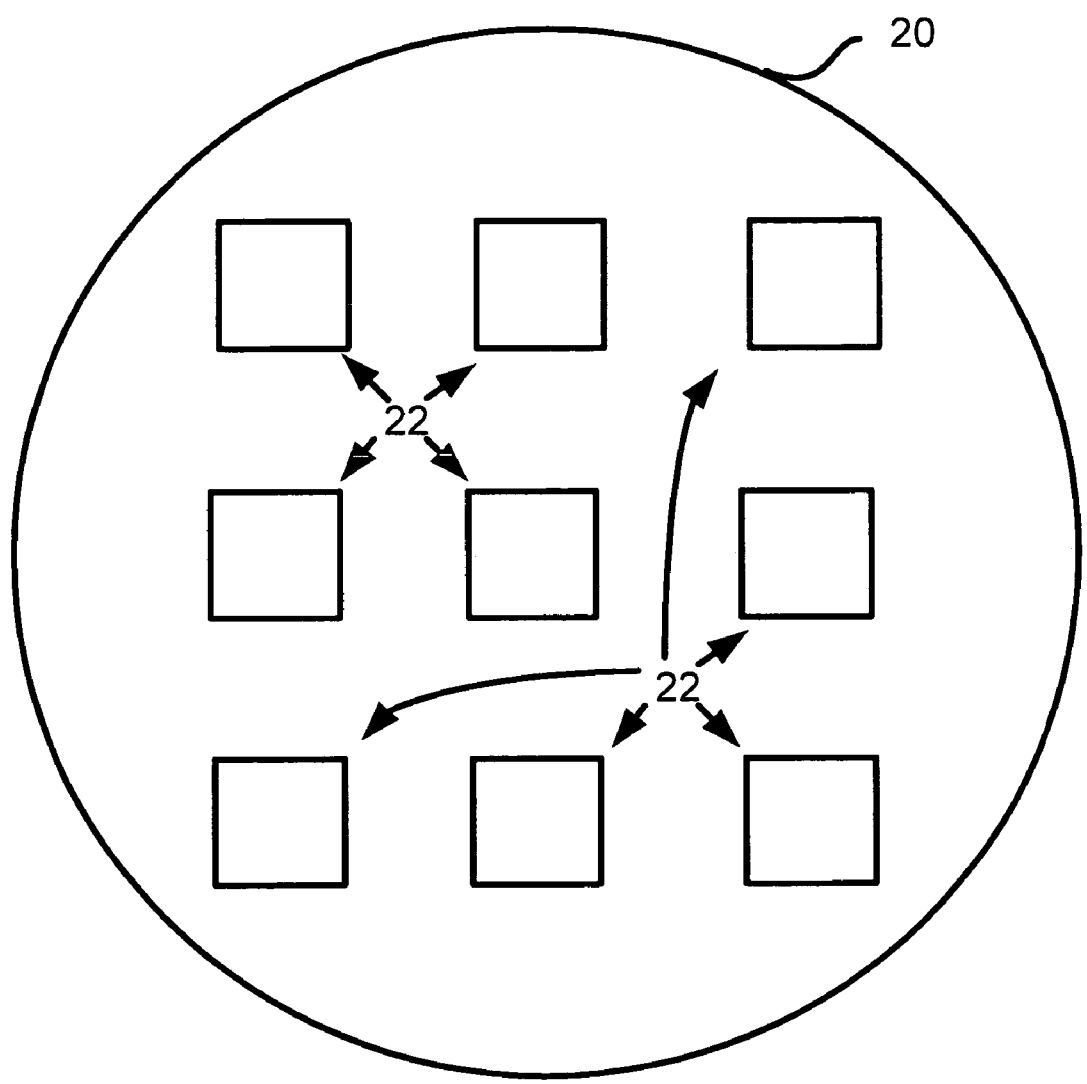
FIG. 3 schematically shows a semiconductor wafer are having a plurality of devices formed thereon.

As an example, FIG. 3 schematically shows a top view of a silicon wafer 20 having nine areas 22 for forming separate semiconductor chips 13. Each area 22 may have the beginnings of structure and/or circuitry (shown generally at areas 22) that ultimately form their respective final chips 13. It should be noted that various embodiments may form more than nine sets of structure and/or circuitry. Accordingly, discussion of nine sets of the structure and/or circuitry for forming nine chips 13 is illustrative. Fewer or more sets therefore may be formed.

Figure 4:
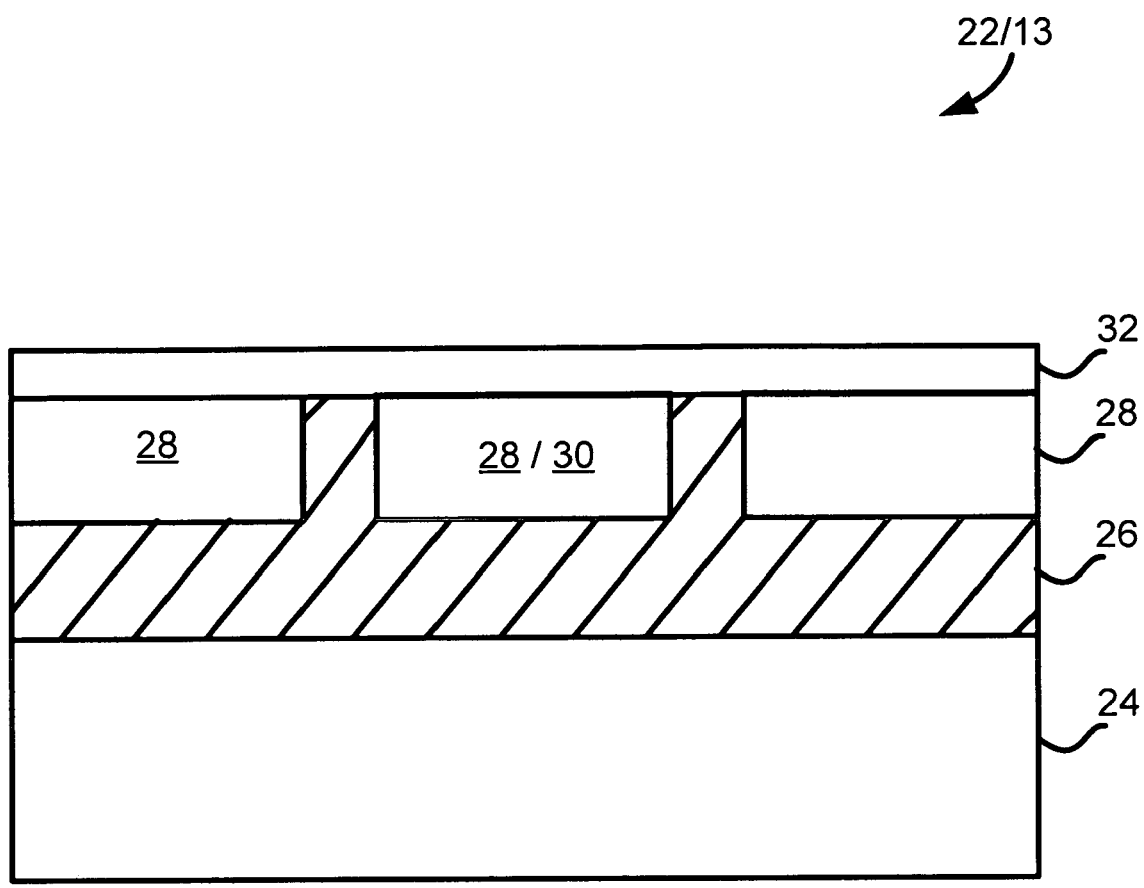
FIG. 4 schematically shows a cross-sectional view of a partially fabricated MEMS device having an organic mask layer on its top surface at step 202 of the process of FIG. 2.

After beginning to form structure and/or circuitry, the process continues to step 202, which deposits an organic material 32 on at least a portion of the top surface of the wafer 20 shown in FIG. 3. In some embodiments, a primer, such as A-174 silane, may be deposited first to improve adhesion of the organic material 32. For illustrative purposes, FIG. 4 schematically shows a simplified, cross-sectional view of one of the nine areas 22 of the wafer 20 shown in FIG. 3 immediately after performing this step. Specifically, the portion of the wafer die shown in FIG. 4 ultimately will form a single MEMS chip 13.

To that end, the chip 13 comprises a silicon substrate 24 supporting a sacrificial oxide 26 and a patterned layer of polysilicon 28. Conventional surface deposition processes and etching techniques previously deposited both the oxide 26 and polysilicon 28 on the silicon substrate 24 shown in FIG. 3 (step 200). In this example, conventional processes also previously etched the polysilicon layer 28 in a manner that forms an unreleased movable member 30 (also step 200). As known by those skilled in the art, the movable member 30 can be released by a subsequent step that removes at least a portion of the oxide layer 26. Details of the releasing step are discussed below.

In accordance with illustrative embodiments of the invention, and as discussed above with regard to step 202, the structure of FIG. 4 also has a top layer of organic material 32. It is this organic material 32 that ultimately will form an organic mask (also identified by reference number 32) for etching or removing lower layers of the structure. In this case, as discussed in greater detail below, the organic mask 32 ultimately will be part of a hydrofluoric acid vapor etch process to remove a portion of the oxide 26, thus releasing the movable member 30.

Appropriate selection of the organic material 32 is important to the proper execution of the fabrication process. Criteria used to select the material includes:
the permeability rate through the material,
the thickness of this material layer,
the potential reaction of the material of the underlying layers, and
the removability of this material layer from the underlying layer.

More specifically, as known by those skilled in the art and using the example above, hydrofluoric acid generally does not chemically attack or etch organic material 32. Instead, it typically diffuses through organic material 32 at some rate. Moreover, when the chemical interaction between a gas and an organic barrier material is relatively small, the gas transport rate through the material can be characterized by a permeation coefficient. This coefficient is the product of the diffusion and solubility coefficients of the material. In essence, the coefficients describe a three-step transport process:

1. Solubility of the gas into the material,
2. Diffusion of dissolved gas through the material, and
3. Desorption of dissolved gas from the material (in this application, it attacks the wafer surface).

Reducing each step enhances masking properties because this process executes in a serial manner. The solubility coefficient (steps 1 and 3) is minimized when chemical similarity between the gas and the material is minimized. The diffusion coefficient (step 2) is minimized by use of highly crystalline materials, highly cross-linked materials (minimal free volume), and chemical dissimilarity. In addition, the overall transport process is inversely proportional to thickness (diffusion step).

A force driving diffusion (step 2) is the concentration gradient of dissolved gas in the material. Accordingly, in illustrative embodiments, the permeation rate may be reduced by using a material that suppresses desorption by maintaining substrate adhesion. With minimal desorption, the concentration gradient (the diffusion driving force) is reduced. To maintain adhesion, it is important to use a material that has a negligible absorption of the gaseous etchant. This is so because, among other reasons, if gas concentration in the material at the interface is near zero, then there is not much available to attack the substrate 24, thus preserving adhesion.

Because some moisture commonly is present in the vapor HF process, hydrophobic, non-moisture-absorbing materials with minimal hydrogen bonding capability are preferred (moisture absorption plasticizes the material—this affects both the diffusion rate and the solubility of HF). Minimal hydrogen bonding capability also is advantageous in processes that add alcohol vapor. Other materials nevertheless could be used.

In illustrative embodiments, the organic material 32 is not photosensitive and may be comprised of a parylene material. For example, illustrative embodiments may use Parylene C.

In other embodiments, the organic material 32 may be photosensitive and comprised of a polyimide material, which is a class of photoresist material having species that are designed to remain on an underlying wafer. Such photoresist typically mechanically isolate stress sensitive circuit elements from the plastic in standard integrated circuit packages, and generally are designed to be applied at greater thicknesses than standard photoresists used in semiconductor fabrication. Moreover, such photoresists generally have a better thermal stability, higher chemical stability, and lower moisture absorption. A full cure generally provides high cross-linked density. In sum, it is anticipated that this class of photoresists should mask hydrofluoric acid vapor (discussed below) better than many other conventional photoresists. For example, among others, this embodiment may be comprised of HD8000, which is distributed by HD Microsystems of Parlin, N.J.

As suggested above, the thickness of the organic material layer 32 is selected based upon, among other things, the permeability rate of the organic material 32, the type of material to be used in the vapor etch (e.g., hydrofluoric acid), and the amount of time required for the vapor etch. Empirical testing should be sufficient to determine an appropriate thickness.

It then is determined at step 204 if the organic material 32 is photosensitive (i.e., if it reacts to certain wavelengths of light). For example, as suggested above, Parylene C is not photosensitive, while HD8000 (i.e., a polyimide) is photosensitive.

Figure 5:
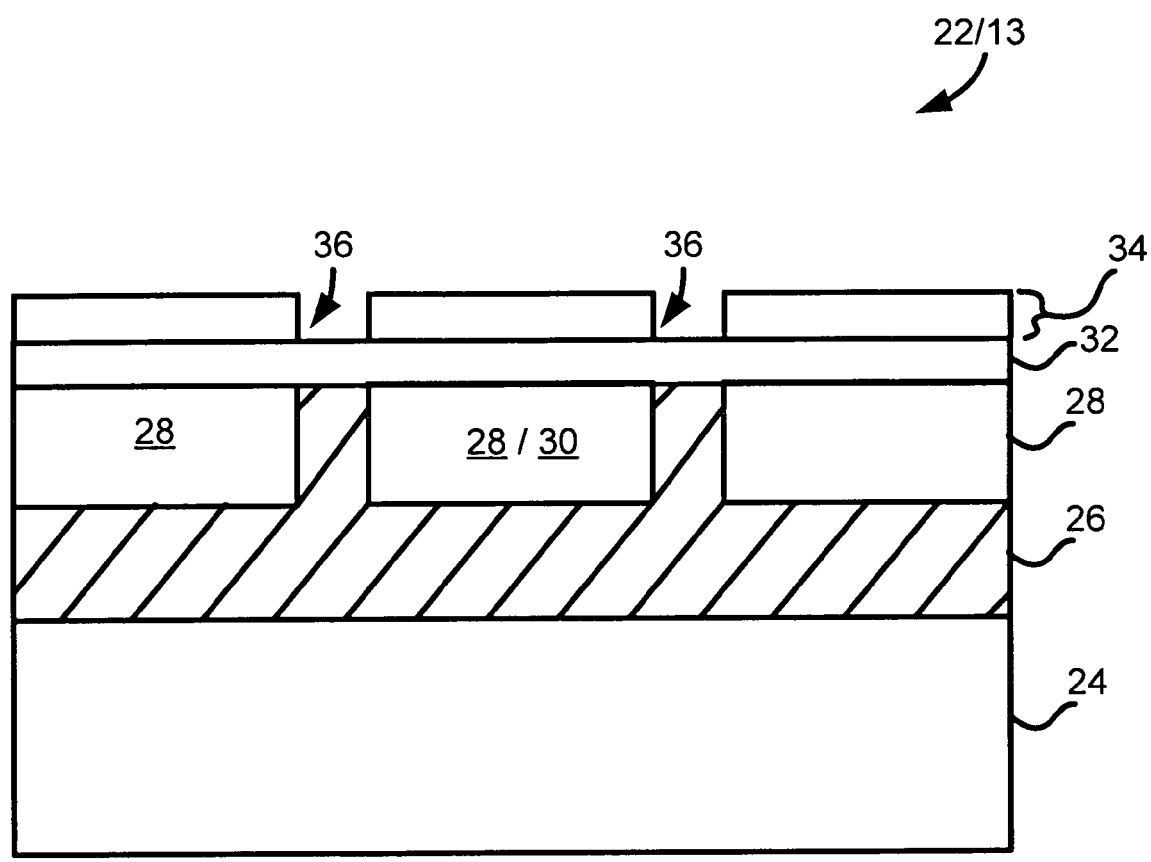
FIG. 5 schematically shows a cross-sectional view of the partially fabricated MEMS device having an organic mask layer and photoresist layer on its top surface at step 206 of FIG. 2.

If the organic material 32 is not photosensitive, then the process continues to step 206, which adds a supplemental mask 34 to the top surface of the organic material 32. As discussed below, the supplemental mask 34 ultimately assists in forming a pattern of holes 38 through the organic material 32. In illustrative embodiments, the supplemental mask 34 comprises a layer of photoresist as shown in FIG. 5.

Accordingly, at step 206, the method adds a layer of photoresist material to the top surface of the organic material 32. As suggested below, the photoresist layer should have a thickness that can withstand a subsequent hole etching process (e.g., using an oxygen plasma) in the underlying organic layer. The process then exposes such photoresist material to a prespecified pattern of light. Such light exposure and subsequent development effectively forms a set of holes 36 through the photoresist material, thus producing the supplemental mask 34. FIG. 5 shows an example of two such holes 36 in the photoresist layer. Specifically, as shown in FIG. 5, those two holes 36 are vertically aligned with oxide 26 that ultimately will be removed in a subsequent vapor etching step, discussed below.

Figure 6:
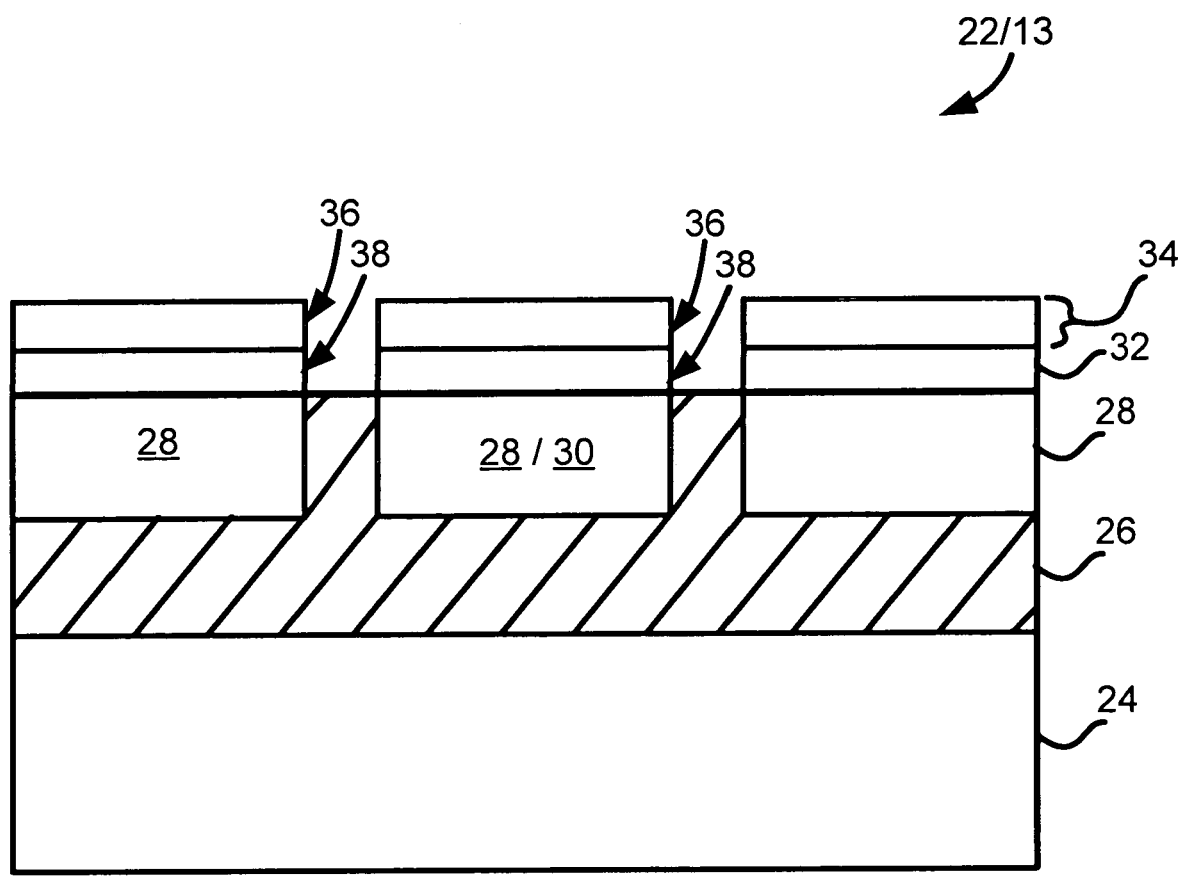
FIG. 6 schematically shows a cross-sectional view of the partially fabricated MEMS device having an organic mask layer with throughholes and a photoresist layer on its top surface at step 208 of FIG. 2.

The process then continues to step 208, which forms a set of holes 38 through the organic material 32. For example, illustrative embodiments may apply an oxygen plasma material to the structure shown in FIG. 5. As known by those skilled in the art, oxygen plasma effectively penetrates through the non-photosensitive layer (i.e., through the parylene in this example). Consequently, the oxygen plasma effectively forms a pattern of holes 38 (through the parylene layer 32) that corresponds of the pattern of holes 36 through the photoresist layer 34. FIG. 6 schematically shows a cross-sectional view of the above noted partially fabricated MEMS device after this step forms the holes 38 through the organic material 32.

In addition, the oxygen plasma also removes a portion of the photoresist. It is anticipated that this partial removal primarily has a thinning effect on the photoresist. It also is anticipated, however, that this partial removal can also have an impact on inner dimension of the holes 36 through the photoresist layer 34, as well as the edges of the supplemental mask 34. Those skilled in the art should be aware of this potential impact and design accordingly. At this stage of the process, conventional techniques may remove the remaining photoresist material (step 210).

Figure 7:
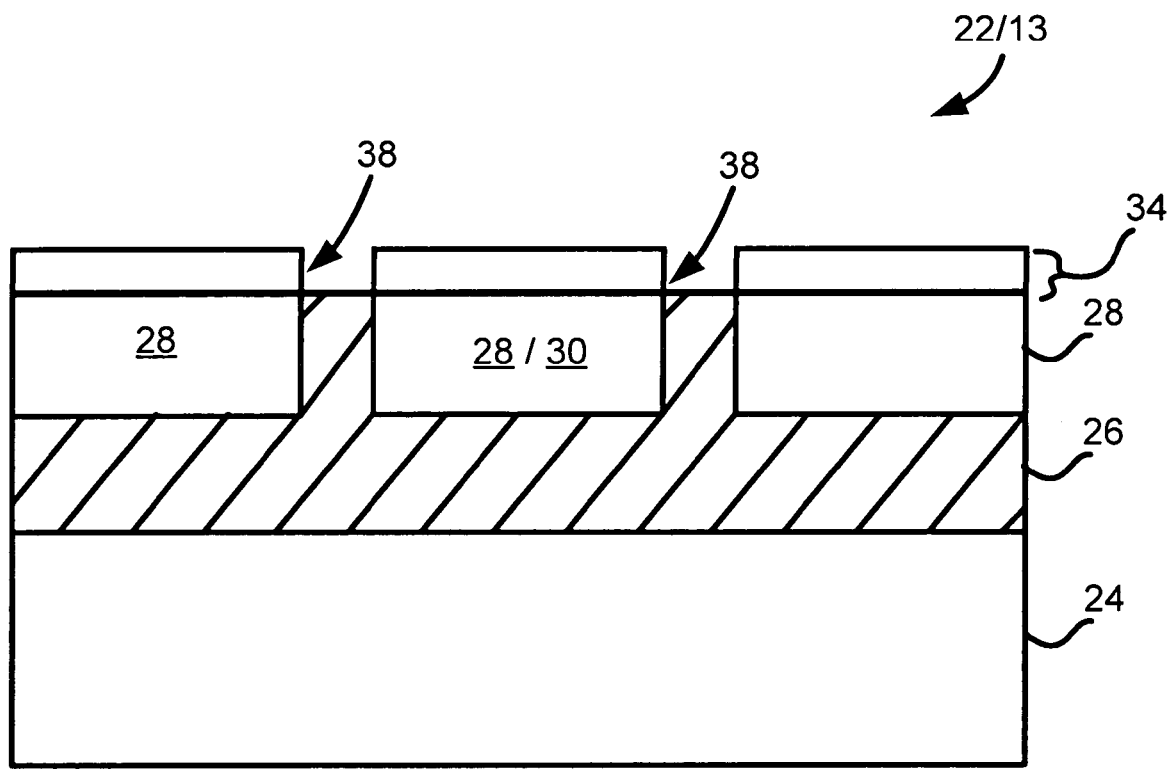
FIG. 7 schematically shows a cross-sectional view of the partially fabricated MEMS device having a photosensitive organic mask layer with throughholes at step 212 of FIG. 2.

Returning to step 204, if the organic material 32 is photosensitive, the process continues to step 212 by applying light in a prespecified pattern to the organic material 32, and then developing it. Consequently, the step forms a prespecified pattern of holes 38 through the organic material 32. FIG. 7 schematically shows a partially fabricated MEMS device at this stage of development. At this point in the process, the partially fabricated MEMS device is ready for conventional vapor etching processes to release the structure or otherwise etch specified portions of the device.

The process therefore continues to step 214, which applies a conventional vapor etch to the partially fabricated MEMS device. In illustrative embodiments, the vapor etch is a conventional hydrofluoric acid vapor etch. Accordingly, using the above example, hydrofluoric acid in vapor form passes through the holes 38 of the organic mask 32 to etch away much of the oxide 26 of the partially fabricated MEMS device. As known by those skilled in art, this etching step effectively releases the movable structure. Moreover, the vapor etch may remove residue formed on surfaces it contacts. For example, the vapor etch may remove residue formed on the movable member 30 during the fabrication process. If not removed, such residue can introduce another source of error into the overall system 10.

Conventional processes then remove at least a portion of the organic mask 32 (step 216). In alternative embodiments, however, the organic mask 32 may remain in place.

The embodiments discussed generally relate to using the organic mask 32 on at least a portion of a single face of the wafer 20. Such embodiments nevertheless may be extended to using the organic mask 32 on both the top and bottom faces of the wafer 20, or on all surfaces of the wafer 20. Similar processes may be used to execute such processes.

In illustrative embodiments, applying a vapor etching process through the holes 38 in the organic mask 32 suggests that the mask 32 protects substantially the entirety of the remainder of the wafer 20 (i.e., that portion of the wafer 20 that is not exposed to holes 38 in the mask). Of course, as noted above, in practice, it is anticipated that there may be edge effects near exposed areas of the wafer 20. Undesired etching of such additional portions of the wafer 20 nevertheless should not be considered to imply that the process is etching other portions of the wafer 20. In other words, in illustrative embodiments, only those portions of the wafer 20 exposed to the holes 38 are considered to be etched despite the fact that some undesired etching of edges may take place.

It should be noted that the process steps discussed in FIG. 2 are illustrative and not intended to be exhaustive. Accordingly, additional steps may be taken to fabricate the MEMS device. For example, the wafer 20 ultimately will be diced, and individual chips 13 may be tested, circuitry may be further formed on the wafer 20, additional circuitry may be formed on the wafer 20, and the chips 13 may be capped, and/or packaged. The steps discussed in FIG. 2 therefore are not intended to limit various embodiments the invention. Moreover, the order of some of the steps of FIG. 2 also may be changed. For example, the organic material 32 may be deposited as a first step in certain instances.

Accordingly, illustrative embodiments improve the efficiency and effective use of vapor etching in semiconductor fabrication processes. Consequently, such embodiments significantly minimize stiction problems because they provide a viable alternative to wet etch processes. Moreover, illustrative embodiments facilitate use of an organic mask, which generally is more readily removable from its underlying surface than an inorganic mask.

Although the above discussion discloses various exemplary embodiments of the invention, it should be apparent that those skilled in the art can make various modifications that will achieve some of the advantages of the invention without departing from the true scope of the invention.

What is claimed is:

1. A method of fabricating a micromachined product, the method comprising:

forming microstructure supported by a wafer;

applying an organic material to at least a portion of the wafer, the organic material comprising parylene;

producing at least one hole in the organic material to form an organic mask; and applying a hydrofluoric acid vapor phase etching process to the wafer through the at least one hole in the organic mask.

2. The method as defined by claim 1 wherein producing comprises:

forming a supplemental mask on the organic material, the supplemental mask having a pattern of one or more holes; and forming at least one hole through the layer of organic material by using the pattern of the supplemental mask.

3. The method as defined by claim 1 further comprising removing at least a portion of the organic mask.

4. The method as defined by claim 1, wherein the microstructure is a MEMS device, the MEMS device including a movable structure, and applying a hydrofluoric acid vapor phase etching process to the wafer releases the movable structure substantially without stiction.

5. A method of processing a semiconductor wafer, the method comprising:

providing a wafer;

depositing a layer of organic material on at least a portion of the face of the wafer, the layer comprising parylene;

forming a mask on the layer of organic material, the mask having at least one hole; and forming at least one hole through the layer of organic material by means of the at least one hole in the mask;

applying a hydrofluoric acid vapor etching process to the wafer through the at least one hole in the layer of organic material.

6. The method as defined by claim 5, wherein the wafer has a top surface and a bottom surface and wherein depositing the layer of organic material includes depositing the layer on the top surface and on the bottom surface of the wafer.

* * * * *